United States Patent
Lee (10) Patent No.: US 6,627,488 B2
(45) Date of Patent: Sep. 30, 2003

(54) METHOD FOR FABRICATING A SEMICONDUCTOR DEVICE USING A DAMASCENE PROCESS

(75) Inventor: Jung Ho Lee, Kyoungki-do (KR)

(73) Assignee: Hynix Semiconductor Inc., Ich'on (KR)

( * ) Notice: Subject to any disclaimer, the term of this patent is extended or adjusted under 35 U.S.C. 154(b) by 0 days.

(21) Appl. No.: 09/891,210

(22) Filed: Jun. 26, 2001

(65) Prior Publication Data

US 2002/0001930 A1 Jan. 3, 2002

(30) Foreign Application Priority Data

Jun. 29, 2000 (KR) ........................... 2000-36535

(51) Int. Cl.⁷ .................... H01L 21/338; H01L 21/336; H01L 21/3205; H01L 29/76; H01L 29/94
(52) U.S. Cl. .................. 438/183; 438/290; 438/291; 438/270; 438/259; 438/589; 257/288; 257/330; 257/332
(58) Field of Search .................. 438/183, 290, 438/291, 289, 270, 271, 259, 197, 589; 257/288, 330, 332

(56) References Cited

U.S. PATENT DOCUMENTS

| | | | | |
|---|---|---|---|---|
| 6,204,137 B1 | * | 3/2001 | Teo et al. ................. | 438/305 |
| 6,235,560 B1 | * | 5/2001 | Ma et al. ................. | 438/150 |
| 6,245,618 B1 | * | 6/2001 | An et al. ................. | 438/289 |
| 6,278,164 B1 | * | 8/2001 | Hieda et al. ............. | 257/410 |
| 6,297,107 B1 | * | 10/2001 | Paton et al. ............. | 438/291 |
| 6,310,367 B1 | * | 10/2001 | Yagishita et al. ......... | 257/190 |
| 6,319,807 B1 | * | 11/2001 | Yeh et al. ............... | 438/595 |
| 6,403,426 B1 | * | 6/2002 | Montree et al. .......... | 438/291 |
| 6,465,842 B2 | * | 10/2002 | Nishinohara ............. | 257/330 |
| 2002/0037619 A1 | * | 3/2002 | Sugihara et al. ......... | 438/289 |

* cited by examiner

*Primary Examiner*—Matthew Smith
*Assistant Examiner*—Chuong Anh Luu
(74) *Attorney, Agent, or Firm*—Finnegan, Henderson, Farabow, Garrett & Dunner, L.L.P.

(57) ABSTRACT

Disclosed herein is a method of fabricating a semiconductor device using a damascene process. The method comprises the steps of: forming a dummy gate electrode on a semiconductor substrate; forming a source/drain region in the substrate; polishing and planarizing an interlayer insulating film formed on the substrate to expose the dummy gate electrode; etching the dummy gate electrode to form a groove in an exposed portion of the substrate; implanting impurity ions into the exposed portion of the substrate to form a delta-doping layer; thermally treating the semiconductor substrate to activate the implanted impurity ions; growing a silicon film on the exposed portion of the substrate by a selective epitaxial process; depositing a gate insulating film on the surface of the groove; and depositing a gate metal film on the gate insulating film in the groove, forming the gate electrode.

20 Claims, 6 Drawing Sheets

METHOD FOR FABRICATING A SEMICONDUCTOR DEVICE USING A DAMASCENE PROCESS

BACKGROUND OF THE INVENTION

1. Field of the Invention

The present invention relates in general to a method for the fabrication of a semiconductor device, and more particularly to a method of fabricating a semiconductor device using a damascene process.

2. Background of the Invention

Generally, semiconductor integration technologies using a damascene process are utilized more often in semiconductor devices that have high integration densities. For example, in a semiconductor fabrication process using a metal film as a gate electrode material, the use of a damascene process results in the formation of a gate electrode after a gate pattern and a source/drain region are formed. This can reduce the semiconductor substrate loss caused by thermal budgets and plasma. In addition, the use of a damascene process allows for the omission of a subsequent oxidation process and hence can prevent generation of the gate electrode defects caused by the oxidation process.

FIGS. 1A to 1E are cross-sectional views showing a method of forming a gate electrode using a damascene process according to the prior art.

Figure 1A:
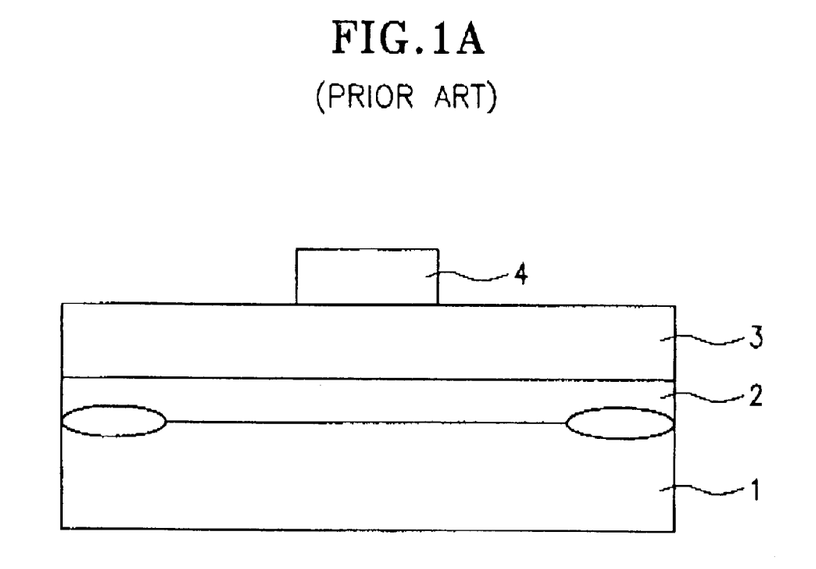
FIGS. 1A, 1B, 1C, 1D and 1E are cross-sectional views showing a fabricating method of a semiconductor device using a damascene process according to the prior art.

First, as shown in FIG. 1A, a semiconductor device 1 includes a device isolation film. A dummy gate insulating film 2 and a dummy gate film 3 are deposited on top of the entire surface of device 1 in sequence. A photoresist pattern 4 is then formed on a gate electrode region of the dummy gate film 3.

Figure 1B:
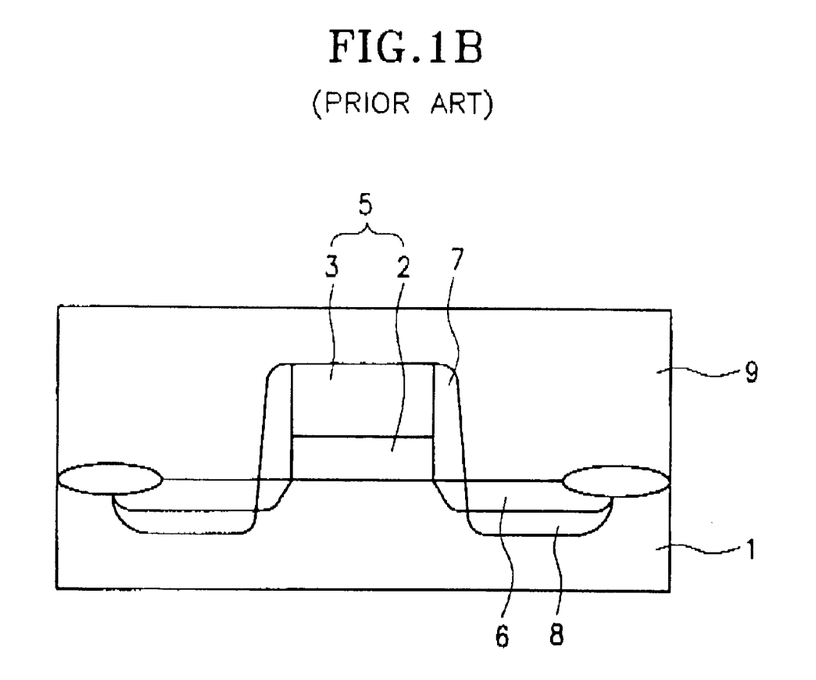

Following its formation, the photoresist pattern is used as an etch barrier while the dummy gate film 3 and dummy gate insulating film 2 are sequentially etched. The etching forms a dummy gate electrode 5, as shown in FIG. 1B.

Next, ions such as low concentration n-type impurity ions, are implanted into the resulting substrate to form a lightly doped drain region LDD 6. Once the ions are implanted the photoresist pattern 4 is removed. Spacers 7 are then formed on both sidewalls of the dummy gate electrode 5 by a known manner. High concentration n-type impurity ions are subsequently implanted into a region intended for a source/drain region and then activated by a thermal process to form a source/drain region 8. Then, an interlayer insulating film 9 for insulating the respective devices is deposited on the resulting substrate.

Figure 1C:
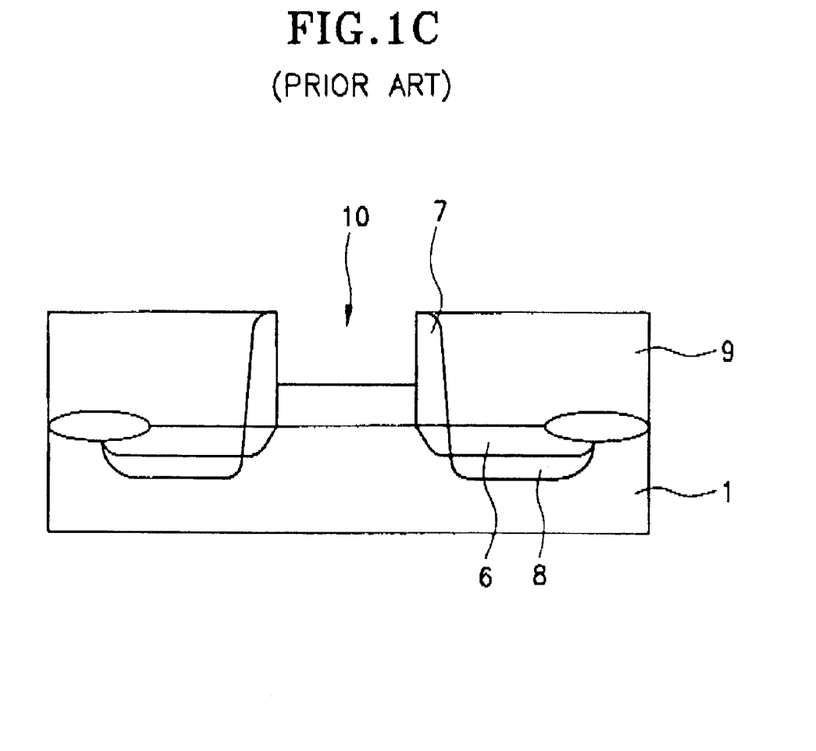

Afterwards, as shown in FIG. 1C, the interlayer insulating film 9 is polished by Chemical Mechanical Polishing (CMP) in such a manner that the dummy gate electrode 5 is exposed. After polishing, the exposed dummy gate electrode 5 is removed by a dry etching process, thereby forming a groove 10 defining a region reserved for a gate electrode.

Figure 1D:
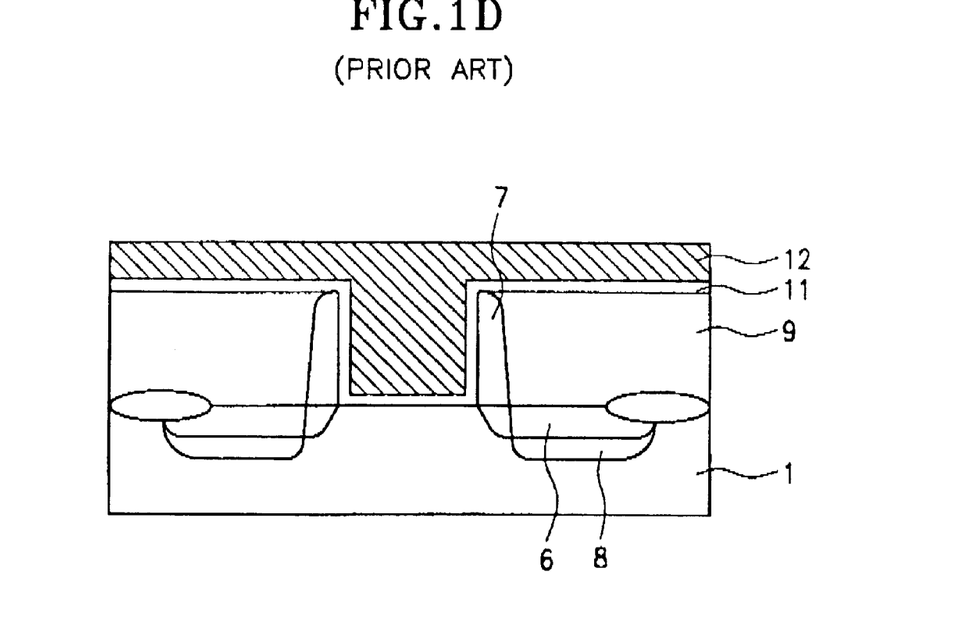

Next, as shown in FIG. 1D, a gate insulating film 11 is formed on the groove 10. The gate insulating film may be a grown thermal oxide film or a deposited high dielectric film. A doped polysilicon or metal film of a sufficient thickness is then deposited on top of the gate insulating film 11 to completely bury the groove 10.

Figure 1E:
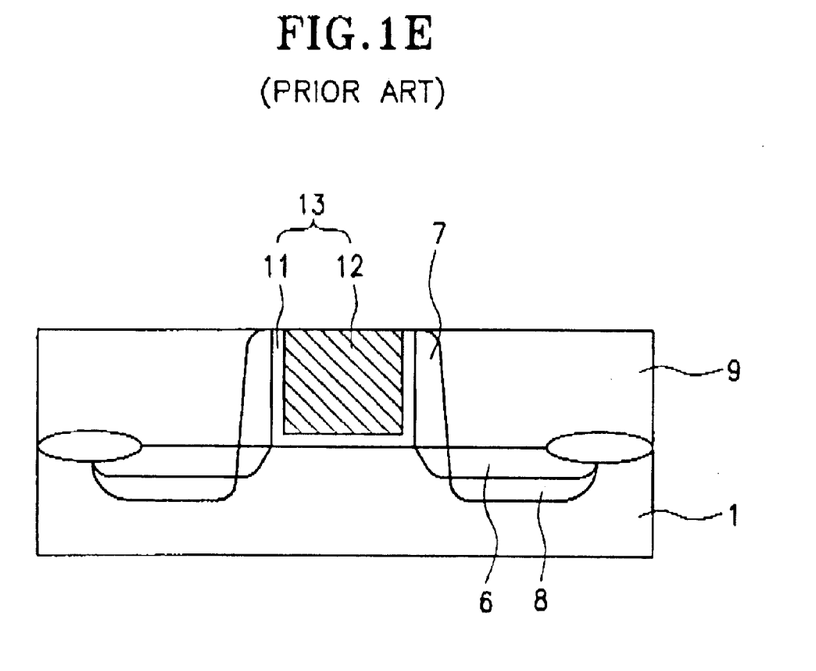

The resulting substrate is then planarized by the CMP process in such a manner that the interlayer insulating film 9 is exposed. As a result, a gate electrode 12 is formed, as shown in FIG. 1E.

Although the conventional method of fabricating semiconductor devices using the damascene process allows gate electrodes to be formed, the method is not without its disadvantages. For instance, when forming the groove by etching the dummy gate electrode, the prior art carries out a dry etching process which results in loss of the semiconductor substrate and produces plasma process damage. Thus, if the resulting substrate having the groove is subjected to the gate electrode forming process as described above, the Gate Oxide Integrity (GOI) is significantly deteriorated.

In an attempt to solve such problems, a sacrificial oxide film is formed after removing the dummy gate electrode. This allows the elimination of the plasma process damage, but can further increase loss of the semiconductor substrate. As a result, the level of a channel region will be lower than the source/drain region. The low level channel region may cause the device to have a significant variance in its current driving force and voltage depending on a region.

SUMMARY OF THE INVENTION

Features of the present invention solve the above problems with the prior art by providing a unique method for fabricating a semiconductor device using a damascene process. The method can achieve a short channel effect even at a low threshold voltage and compensates for the substrate height loss caused by dry etching while eliminating plasma process damage caused by the dry etching.

It is another aspect of the present invention to provide a method for fabricating a semiconductor device using a damascene process, wherein the method can be carried out in a more stable manner and can improve the electrical properties of the device while enlarging a process margin to improve a yield of products.

The present invention provides a method for fabricating a semiconductor device using a damascene process, comprising the step of: depositing a dummy gate insulating film and a dummy gate electrode on a semiconductor substrate having a device isolation film; forming a source/drain region of a LDD structure in the semiconductor substrate; forming an interlayer insulating film on the resulting substrate; polishing and planarizing the interlayer insulating film by a Chemical Mechanical Polishing (CMP) until the dummy gate electrode is exposed; etching the dummy gate electrode using a dry etching process so as to expose the semiconductor substrate, thereby forming a groove; implanting impurity ions into the exposed portion of the substrate at a low ion implantation energy to form a delta-doping layer; heat-treating the resulting semiconductor substrate to diffuse the implanted impurity ions; growing a silicon film on the exposed portion of the substrate by a selective epitaxial process; depositing a gate insulating film on the surface of the groove; and depositing a gate metal film on the gate insulating film in the groove, thereby forming a gate electrode.

BRIEF DESCRIPTION OF THE DRAWINGS

Various advantages, features and aspects of the invention will be apparent from the following description of embodiments with reference to the accompanying drawings, in which.

DETAILED DESCRIPTION OF THE INVENTION

A fabricating method of a semiconductor device according to the present invention will now be described in detail with reference to the accompanying drawings.

Figure 2A:
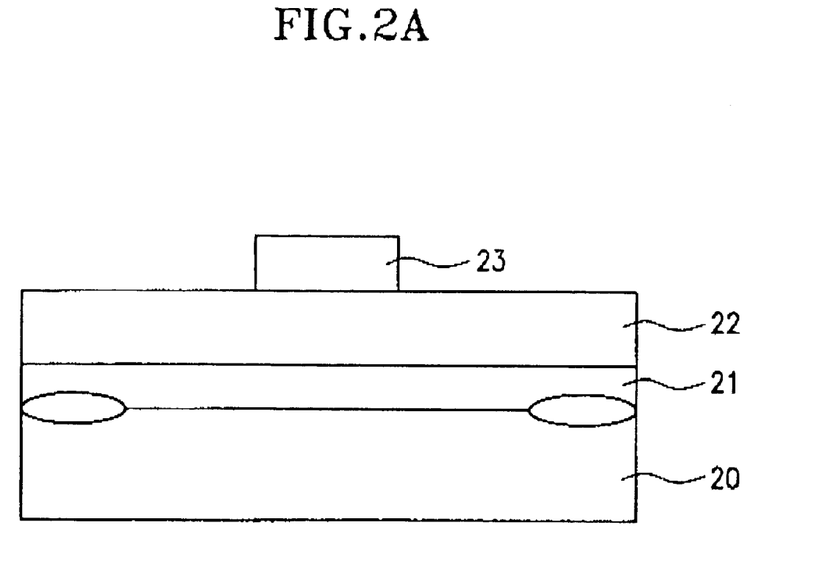
FIGS. 2A, 2B, 2C, 2D, 2E and 2F are cross-sectional views showing a fabricating method of a semiconductor device using a damascene process according to the present invention.

Referring to FIG. 2A, a semiconductor substrate 20 having a device isolation film is shown. On top of the overall surface of substrate 20 there are deposited a dummy gate oxide film 21 and a dummy gate silicon electrode film 22 in sequence. The dummy gate electrode silicon film 22 may be formed of a doped or non-doped polysilicon film having a thickness of 700 to 1,500 Å. A photoresist pattern 23 is then formed on a gate electrode region of the dummy gate electrode silicon film 22.

Figure 2B:
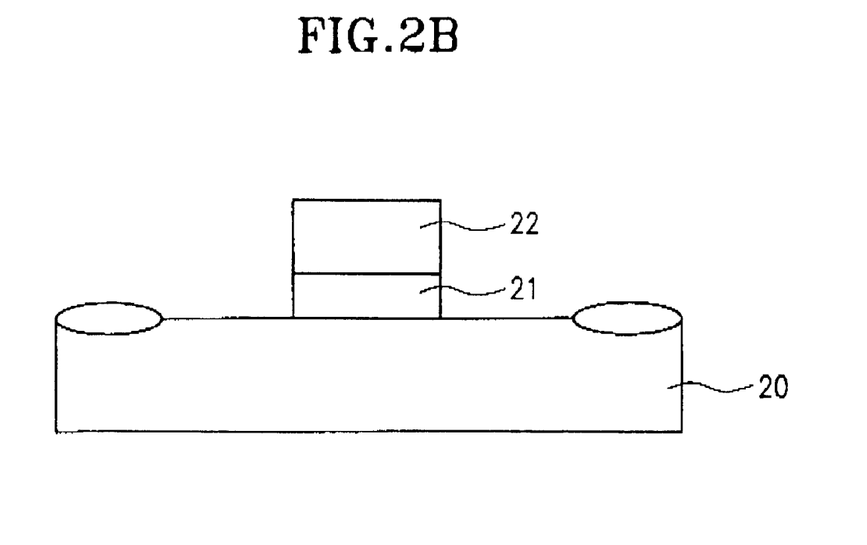

Once deposited, the dummy gate electrode silicon film 22 and the dummy gate oxide film 21 are etched in sequence using the photoresist pattern 23 as an etching barrier, thereby forming a dummy gate electrode, as shown in FIG. 2B. After the dummy gate electrode is formed, the photoresist pattern 23 is removed.

Figure 2C:
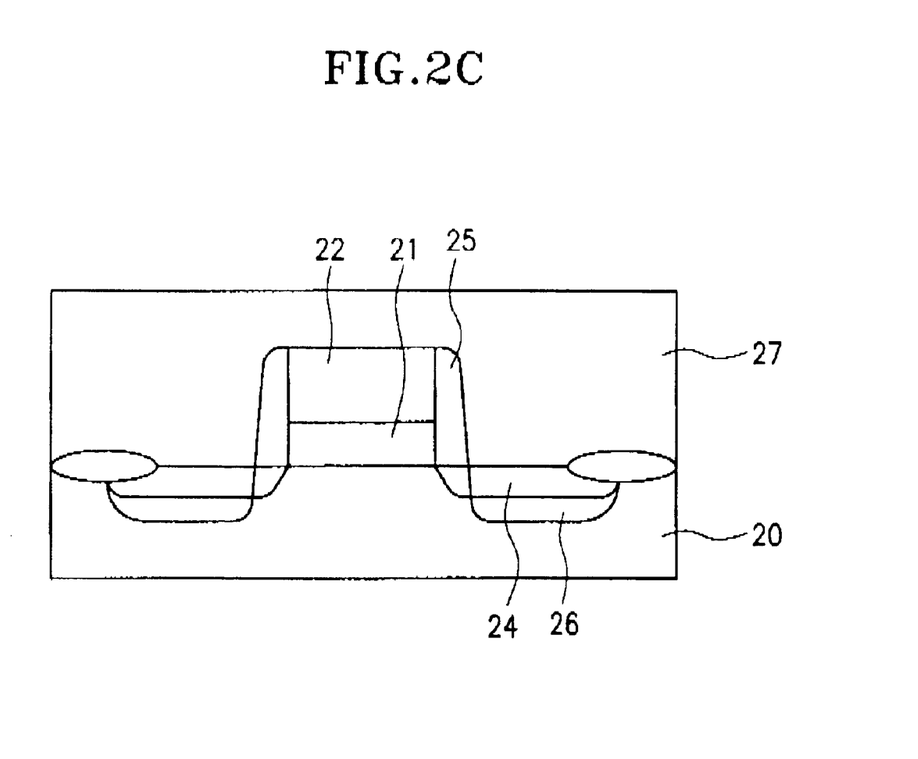

Next, as shown in FIG. 2C, low concentration impurity ions are implanted into the substrate at a region intended for a source/drain region forming a LDD region 24. Spacers 25 are then formed on both sidewalls of the dummy gate electrode. The spacers 25 may be formed to have a thickness of about 200 and 500 Å.

Afterwards, the resulting substrate 20 is implanted with high concentration impurity ions, and thermally treated to diffuse the implanted ions, thereby forming a source/drain region 26. An interlayer insulating film 27 is then deposited on the entire surface of the resulting substrate 20 so as to insulate the respective devices.

Figure 2D:
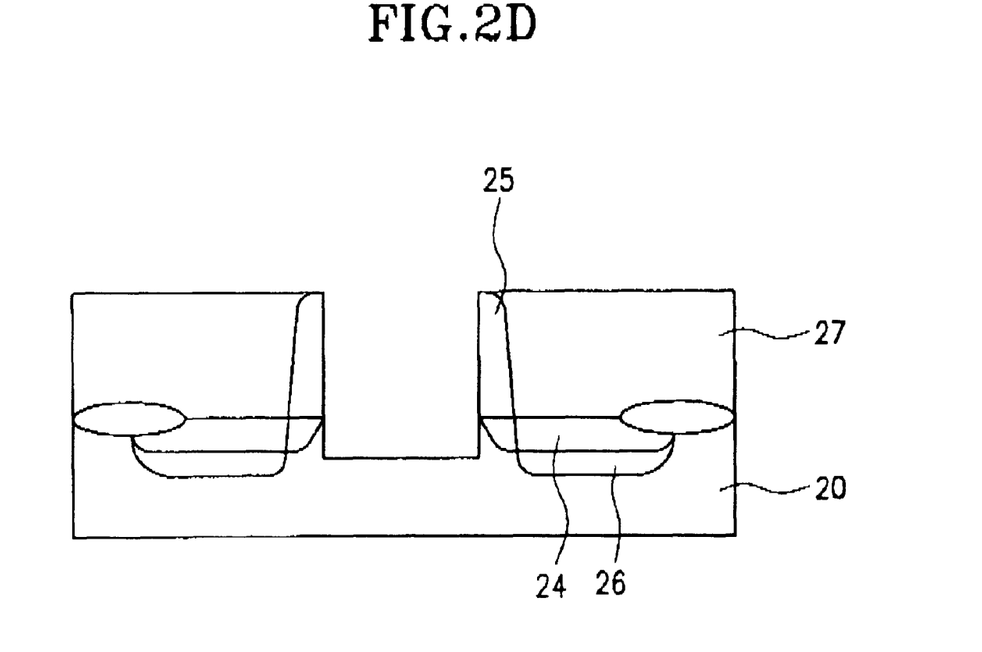

After being deposited, the interlayer insulating film 27 is polished and planarized by the CMP process until the dummy gate electrode is exposed, as shown in FIG. 2D. Then, the dummy gate electrode is etched to expose the semiconductor substrate 20. The etching may be performed by a dry etching process. The semiconductor substrate 20 is etched to a given thickness and thus exposed. The substrate thickness removed by the etching may be in the range of 100 to 300 Å.

Figure 2E:
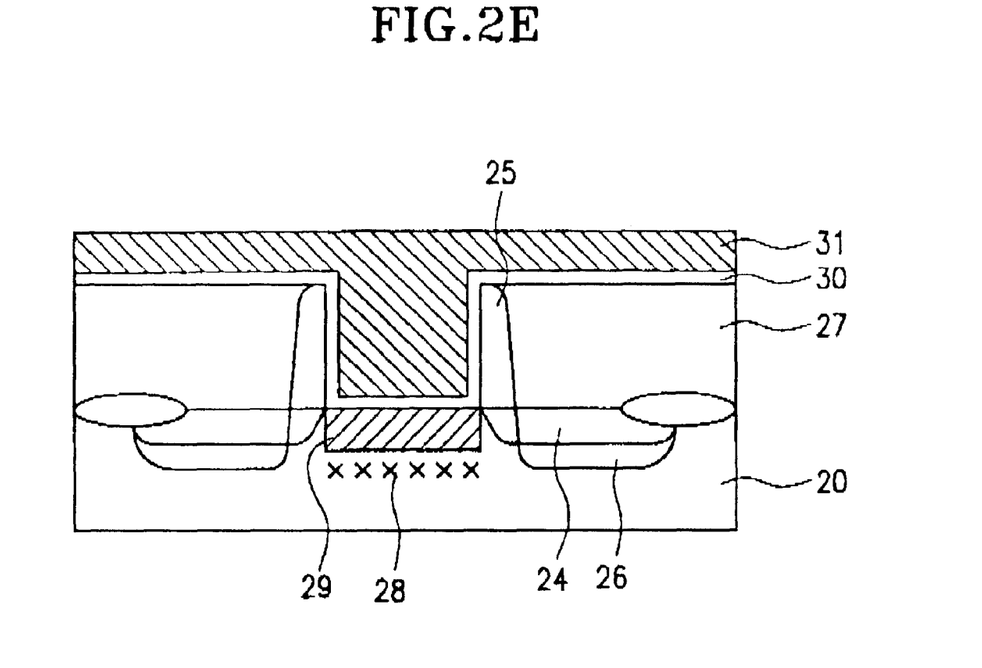

After etching, ions are implanted into the exposed portion of the substrate 20 at a low ion implantation energy to form a delta-doping layer 28, as shown in FIG. 2E. If the substrate 20 is made of nMOS, boron ions are implanted at a dopant concentration of $5\times10^{12}$ to $1\times10^{14}$ and an ion implantation energy of 1–5 KeV. For boron difluoride ions, they are implanted at an ion implantation energy of 3–15 KeV.

The resulting substrate 20 is then subjected to a heat treatment to duffuse the implanted ions. This heat treatment is conducted in a furnace at a temperature ranging from 500° C. to 700° C. for a period of time of 2 hours or less.

A silicon film 29 is subsequently formed on the exposed portion of the substrate 20 by a selective epitaxial process. The silicon film 29 grown by the selective epitaxial process may be formed of a non-doped polysilicon film or a SiGe film which contains about 20% or less of Ge to increase mobility. The silicon film 29 may have a thickness of about 100 to 600 Å. If SiGe film is used as the silicon film 29, a further top silicon film is capped on the SiGe film to a thickness of 50 Å in order to prevent Ge of the film from being dissolved in a subsequent cleaning process.

The silicon film 29 is selectively formed on the exposed portion of the semiconductor substrate using Low Pressure Chemical Vapor Deposition (LPCVD) or High Vacuum Chemical Vapor Deposition (HVCVD).

In the event the silicon film 29 is formed by LPCVD, the substrate is subjected to a hydrogen bake for 1 to 5 minutes at a temperature of 800 to 900° C. prior to forming the silicon film 29. Then, the deposition of the silicon film 29 is carried out in-situ using a mixed gas of dichlorosilane (DCS) and HCl under a pressure of 10 to 100 torr at a temperature of 750 to 950° C. for 3 to 10 minutes. The DCS gas may be used at a flow rate of about 30 to 300 SCCM, and the HCl gas is used in the flow rate of about 30 to 200 SCCM. On the other hand, when the silicon film 29 is formed by HVCVD, the deposition is carried out under a pressure of less than 1 torr at a temperature of 600 to 700° C. using silane or disilane as a depositing gas.

Once the silicon film 29 is formed, a gate insulating film 30 and a gate metal film 31 are deposited on the resulting substrate in sequence.

Figure 2F:
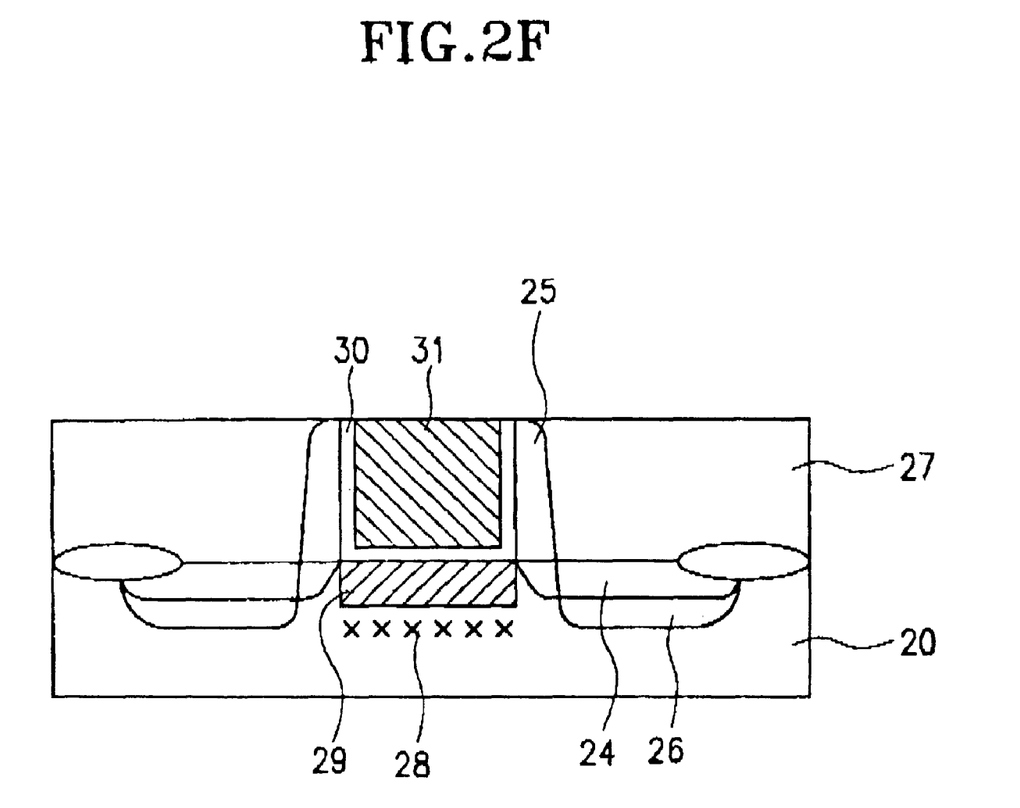

Next, as shown in FIG. 2F, the gate metal film 31 and the gate insulating film 30 are etched in such a manner that the interlayer insulating film 27 is exposed. As a result, a gate electrode is formed.

As apparent from the foregoing, the present invention provides a method of forming a gate electrode on a semiconductor substrate using a damascene process. To inhibit a damage of a channel region due to dry-etching the dummy gate electrode, the method of the present invention performs the ion implantation at a low ion implantation energy to form a delta-doping layer after carrying out the dry etching process. Then, a thin silicon film is formed by the selective epitaxial growth. As a result, the method of the present invention can provide the device having a high-doped channel structure by virtue of SSR (Super Steep Retrograde) and thus having a good short channel effect even at low threshold voltage. Another advantage of the method of the present invention is the compensation for the substrate height loss caused by the dry etching while eliminating plasma process damage occurred in the dry etching.

Therefore, the method of the present invention can be carried out in a more stable manner and can increase electrical properties of the device. Also, it can enlarge a process margin to improve product yields.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating a semiconductor device using a damascene process, comprising the steps of:

forming a dummy gate electrode on a semiconductor substrate;

forming an interlayer insulating film on the resulting substrate;

polishing and planarizing the interlayer insulating film to expose the dummy gate electrode;

etching the dummy gate electrode using a dry etching process to expose the semiconductor substrate, thereby forming a groove;

implanting impurity ions into the exposed portion of the substrate in the groove to form a delta-doping later in the substrate under the groove;

thermally treating the semiconductor substrate;

growing a silicon film on the exposed portion of the substrate in the groove by a selective epitaxial process;

forming a gate insulating film on the surface of the groove including the silicon film; and forming a gate electrode on the gate insulating film in the groove.

2. The method of claim 1, wherein forming a dummy gate electrode further includes:
forming spacers on sidewalls of the dummy gate electrode, wherein the spacers are formed to have a thickness between 200 to 500 Å.

3. The method of claim 1, wherein implanting the impurity ions is carried out by one of implanting boron at an ion concentration between $5 \times 10^{12}$ to $1 \times 10^{14}$ and an ion implantation energy between 1 to 5 KeV and by implanting boron difluoride ions at an ion concentration between $5 \times 10^{12}$ to $1 \times 10^{14}$ and an ion implantation energy of 3 to 15 KeV.

4. The method of claim 1, wherein thermally treating the semiconductor substrate is carried out in a furnace at a temperature in the range of 500 to 700° C. for a time period of 2 hours or less.

5. The method of claim 1, in which the silicon film grown in the selective epitaxial process is formed of one of a non-doped silicon film, and a SiGe film containing about 20% or less of Ge.

6. The method of claim 1, wherein the grown silicon film has a thickness between 100 to 600 Å.

7. The method of claim 1, wherein the silicon film is a SiGe film, and a top silicon film is capped on the SiGe film to a thickness of 50 Å in order to prevent Ge of the film from being dissolved in a subsequent cleaning process.

8. The method of claim 1, wherein the silicon film grown by the selective epitaxial process is selectively formed on the exposed portion of the substrate by one of Low Pressure Chemical Vapor Deposition and High Vacuum Chemical Vapor Deposition.

9. The method of claim 8, wherein prior to initiating the formation of the silicon film, conducting a hydrogen bake at a temperature between 800 to 900° C. for about 1 to 5 minutes, and wherein the formation of the silicon film is performed by a Low Pressure Chemical Vapor Deposition carried out under a deposition pressure between 10 to 100 torr at a temperature between 750 to 950° C. between 3 to 10 minutes using a mixed gas of DCS and HCl as a depositing gas, wherein the DCS gas is used at a flow rate between 30 to 300 SCCM and the HCl gas is used at a flow rate between about 30 to 200 SCCM.

10. The method of claim 8, wherein the silicon film is formed by High Vacuum Chemical Vapor Deposition carried out under a deposition pressure of 1 torr or less at a temperature of 600 to 700° C. using one of silane and disilane as a depositing gas.

11. The method of claim 1, wherein the dummy gate electrode consists of a dummy gate insulating film and a dummy gate silicon film.

12. The method of claim 11, wherein the dummy gate silicon film is deposited to a thickness between about 700 to 1500 Å.

13. The method of claim 1, wherein the dummy gate electrode is etched by dry etching process.

14. The method of claim 1, further the steps of:
forming spacers on both sidewalls of the dummy gate electrode; and
forming a source/drain region in the semiconductor substrate.

15. The method of claim 13, wherein a semiconductor substrate thickness removed in the dry etching process is in the range between 100 to 300 Å.

16. A method for fabricating a semiconductor device using a damascene process, comprising the steps of:
forming a dummy gate electrode on a semiconductor substrate;
forming spacers on both sidewalls of the dummy gate electrode;
forming source and drain regions in the semiconductor substrate;
forming an interlayer insulating film on the resulting substrate;
polishing and planarizing the interlayer insulating film to expose the dummy gate electrode;
etching the dummy gate electrode using a dray etching process to expose the semiconductor substrate, thereby forming a groove;
implanting impurity ions into the exposed portion of the substrate in the groove to form a delta-doping layer in the substrate under the groove;
thermally treating the semiconductor substrate;
forming a selective epitaxial film on the exposed portion of the substrate, said forming a selective epitaxial film comprising one of low pressure chemical vapor deposition and high vacuum chemical deposition;
forming a gate insulating film on the surface of the groove including the selective epitaxial film; and
forming a gate electrode on the gate insulating film in the groove.

17. The method of claim 16, wherein thermally treating the semiconductor substrate is carried out in a furnace at a temperature in the range of 500 to 700° C. for a time period of 2 hours or less.

18. The method of claim 16, wherein the epitaxial film is formed of one of a non-doped silicon film, and a SiGe film containing about 20% or less of Ge.

19. The method of claim 16, wherein prior to initiating the formation of the epitaxial film, conducting a hydrogen bake at a temperature between 800 to 900° C. for about 1 to 5 minutes, and wherein the formation of the epitaxial film is performed by the low pressure chemical vapor deposition carried out under a deposition pressure between 10 to 100 torr at a temperature between 750 to 950° C. between 3 to 10 minutes using a mixed gas of DCS and HCl as s depositing gas, wherein the DCS gas is used at a flow rate between 30 to 300 SCCM and the HCl gas is used a flow rate between about 30 to 200 SCCM.

20. The method of claim 16, wherein the epitaxial film is formed by high vacuum chemical vapor deposition carried out under a deposition pressure of 1 torr or less at a temperature of 600 to 700° C. using one of silane and disilane as a depositing gas.

* * * * *

UNITED STATES PATENT AND TRADEMARK OFFICE
CERTIFICATE OF CORRECTION

PATENT NO. : 6,627,488 B2
DATED : September 30, 2003
INVENTOR(S) : Jung Ho Lee

It is certified that error appears in the above-identified patent and that said Letters Patent is hereby corrected as shown below:

Column 4,
Line 61, "later" should read -- layer --.

Column 6,
Line 20, "dray" should read -- dry --.
Line 49, "HCl as s" should read -- HCl as a --.
Line 51, "used a" should read -- used at a --.

Signed and Sealed this

Twentieth Day of April, 2004

JON W. DUDAS
*Acting Director of the United States Patent and Trademark Office*